US008723026B2

(12) United States Patent
Zang et al.

(10) Patent No.: US 8,723,026 B2
(45) Date of Patent: May 13, 2014

(54) PARALLEL COAXIAL MOLECULAR STACK ARRAYS

(75) Inventors: Ling Zang, Salt Lake City, UT (US); Yanke Che, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 186 days.

(21) Appl. No.: 13/387,141

(22) PCT Filed: Jul. 27, 2010

(86) PCT No.: PCT/US2010/043409
§ 371 (c)(1),
(2), (4) Date: Apr. 9, 2012

(87) PCT Pub. No.: WO2011/017111
PCT Pub. Date: Feb. 10, 2011

(65) Prior Publication Data
US 2012/0186639 A1    Jul. 26, 2012

Related U.S. Application Data
(60) Provisional application No. 61/228,891, filed on Jul. 27, 2009.

(51) Int. Cl.
*H01L 31/00* (2006.01)
*H01L 21/00* (2006.01)

(52) U.S. Cl.
USPC ............................... 136/263; 136/255; 438/82

(58) Field of Classification Search
CPC ............ H01L 51/0035; H01L 51/0046; H01L 51/4253
USPC ...................... 136/255, 263; 438/82
See application file for complete search history.

(56) References Cited

U.S. PATENT DOCUMENTS 5,698,048 A    12/1997    Friend et al.
6,580,027 B2    6/2003    Forrest et al.
(Continued)

FOREIGN PATENT DOCUMENTS

JP    2003036896    2/2003
JP    2007067115    3/2007
WO    WO 2008056126    5/2008

OTHER PUBLICATIONS

Zang, et al; "One-Dimensional Self-Assembly of Planar π-Conjugated Molecules: Adaptable Building Blocks for Organic Nanodevices"; Acc. Chem. Res., Jul. 11, 2008, 41 (12), 1596-1608.
(Continued)

*Primary Examiner* — Eli Mekhlin
(74) *Attorney, Agent, or Firm* — Thorpe North & Western LLP

(57) ABSTRACT

A coaxial molecular stack (10) for transferring photocurrent generation in a device such as a solar cell (14) is disclosed. The device comprises a plurality of macrocyclic π-conjugated planar molecules stackable through columnar self assembly to form a stack (10) having an axial channel (26) with an outer p-channel (22) of the nano-composite coaxial molecular stack (10). A plurality of C60 molecules are positioned coaxially within the axial channel of the stack (10) to form an inner n-channel (24) that forms a bulk heterojunction with the p-channel (22) to provide charge transport of photocurrent through the nano-composite coaxial molecular stack (10). A plurality of the stacks (16) are oriented orthogonally between first (18) and second electrodes (20) to form the device (14).

20 Claims, 10 Drawing Sheets

(56) References Cited

U.S. PATENT DOCUMENTS

| | | |
|---|---|---|
| 7,259,324 B2 | 8/2007 | Zeira |
| 7,326,955 B2 | 2/2008 | Forrest et al. |
| 7,511,217 B1 | 3/2009 | Roscheisen et al. |
| 2004/0067324 A1 | 4/2004 | Lazarev et al. |
| 2004/0142183 A1 | 7/2004 | Lazarev et al. |
| 2006/0181854 A1 | 8/2006 | Freedman |
| 2007/0047056 A1 | 3/2007 | Kempa et al. |
| 2007/0217965 A1* | 9/2007 | Johnson et al. ............... 422/139 |
| 2012/0186639 A1 | 7/2012 | Zang et al. |

OTHER PUBLICATIONS

PCT Application PCT/US2010/044927; filed Aug. 9, 2010; Kim Min Soo; International Search Report mailed May 13, 2011.

PCT Application PCT/US2010/043409; Ling Zang; filed Jul. 27, 2010; International Search Report mailed Apr. 21, 2011.

Yang, et al.; "Improvement of the performance of polymer C-60 photovoltaic cells by small-molecule doping" Synthetic Metals, 137 (2003); pp. 1521-152.

Zhang et al; Reaction Pathways Leading to Arylene Ethynylene Macrocycles via Alkyne Metathesis; Jornal of the American Chemical Society; 2005; 127; 11863-11870.

Zhang et al; Shape-Persistent Macrocycles: Structures and Synthetic Approaches from Arylene and Ethynylene Building Blocks (A Review); Angew. Chem., 2006; 45; 4416-4439.

Wang, et al; "Ordered polythiophene/fullerene composite core-shell nanorod arrays for solar cell applications"; IOP Publishing; Nanotechnology 20 (2009) 075201.

Naddo, et al.; "Detection of Explosives with a Fluorescent Nanofibril Film"; JACS Communications; J.Am. Chem. Soc. (129; pp. 6978-6975;published on Web May 15, 2007.

Zhao, et al.; "Shape-persistent arylene ethynylene macrocycles: synthesis and supramolecular chemistry"; The Royal Society of Chemistry 2003; vol. 7; Chem. Commun. pp. 807-818.

Drori, et al.; "Below-Gap Excitation of π-Conjugated Polymer-Fullerene Blends: Implications for Bulk Organic Heterojunction Solar Cells"; Physical Review Letters 101; Jul. 18, 2008.

Zhang; et al., "Arylene Ethynylene Macrocycles Prepared by Precipitation-Driven Alkyne Metathesis"; JACS Communications; J. Am. Chem Soc (126); p. 12796; published Sep. 15, 2004.

* cited by examiner

PARALLEL COAXIAL MOLECULAR STACK ARRAYS

RELATED APPLICATION

This application claims the benefit of U.S. Provisional Patent Application No. 61/228,891, filed Jul. 27, 2009 and which is incorporated herein by reference.

BACKGROUND

Organic based solar cells have distinct advantages over their inorganic counterparts, such as low cost of fabrication, ease for large area processing, and compatibility with flexible and light weight plastic substrates, and thus have attracted enormous amount of research interest and effort in the past decades. However, the organic cells typically suffer from the low efficiency of light conversion (usually less than 5%) that inhibits their use in practical applications at the present.

The efficiency of organic solar cells is largely determined by four basic, consequential processes: exciton diffusion; charge generation via electron transfer; charge separation and transport. Although recent developments of bulk-heterojunction materials (e.g., polymer/C60) has shown promise in improving the first two processes by creating charge separation via photoinduced intra- and inter-molecular electron transfer, the poor organization and/or phase segregation of the bulk-mixed materials still limit the charge transport.

SUMMARY

A photocurrent generation device having a nano-composite coaxial cable can include a plurality of stacks. The plurality of stacks can be located between and oriented substantially perpendicular to at least one first electrode and at least one second electrode to enable photocurrent to flow through the stacks. Each stack can have an outer p-channel and an inner n-channel to provide a charge transport for photocurrent between the first and second electrodes. The outer p-channel can include a plurality of macrocyclic π-conjugated planar molecules stacked through columnar self assembly to form the outer p-channel of the nano-composite coaxial cable and having an axial channel therein. The inner n-channel can include a plurality of C60 molecules positioned coaxially within the axial channel of the stack to form the inner n-channel. Collectively, the plurality of stacks form an ordered heterojunction to provide charge transport of photocurrent in the photocurrent generation device.

The stack-electrode sandwich structure can be formed using any suitable approach. Generally, the macrocyclic π-conjugated planar molecules can be prepared with suitable moieties to obtain the inner and outer channel properties as more fully described below. These macrocyclic π-conjugated planar molecules can be self-assembled into arrays of parallel nano-composite coaxial cable stacks. Generally, the self-assembly can be performed directly on one of the two electrodes, e.g., the transparent glass electrode made of indium tin oxides (ITO). The second electrode can then be formed over the assembled stacks.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIGS. 4A and 4B collectively illustrate the strong association between C60 and the hexacycle AEM. Strong association between C60 and a hexacycle (HC) AEM was indicated by the dramatic color change of C60 solution (0.5 mM in toluene) upon addition of 1:1 HC. To complete the association, the mixture solution was heated at 140° C. for 10 min. The strong host-guest association was also consistent with the absorption spectral measurement (0.1 mM HC and C60), for which an increased absorption around 450 nm was observed. The solution of HC is colorless, having no absorption above 400 nm. The strong charge-transfer association results in significant fluorescence quenching of HC (50 μM in toluene) when mixed with C60 at 1:1 molar ratio. The side-chain structure (R—) is shown in FIG. 3A.

These figures are not necessarily to scale and actual dimensions may, and likely will, deviate from those represented. Thus, the drawings should be considered illustrative of various aspects of the invention while not being limiting. Reference will now be made to the exemplary embodiments illustrated, and specific language will be used herein to describe the same. It will nevertheless be understood that no limitation of the scope of the invention is thereby intended.

DETAILED DESCRIPTION

New nanocomposite materials can be readily processed into large-area thin films and specifically structured for highly efficient photocurrent production.

Figure 1A:
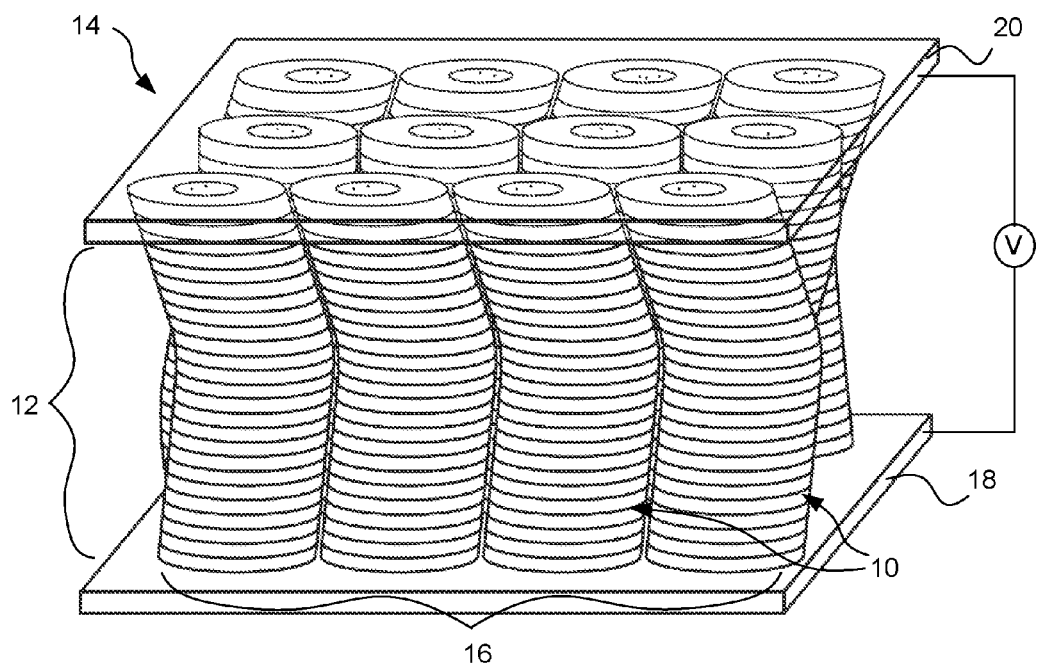
FIG. 1A is a perspective schematic of a solar cell assembly including an array of coaxial stacks between two electrodes.

Nano-composite materials can be used to fabricate thin films of nanostructured coaxial cables 10 (nano-coax) via molecular engineering and self-assembly, as illustrated in FIG. 1A. The nano-coax cables possess both a large-area intermolecular heterojunction interface to facilitate charge separation and a well-ordered, continuous conduit for efficient charge transport. More specifically, the nano-coax cables 10 can be placed in a nano-coax thin film 12 to form an active layer in photovoltaic cells 14. A photocurrent generation device can generally have a nano-composite coaxial cables structured for photocurrent production formed as a plurality or array of stacks 16. The plurality of stacks 16 can be located between and oriented substantially perpendicular to at least one first electrode 18 and at least one second electrode 20 to enable photocurrent to flow through the stacks.

Figure 1B:
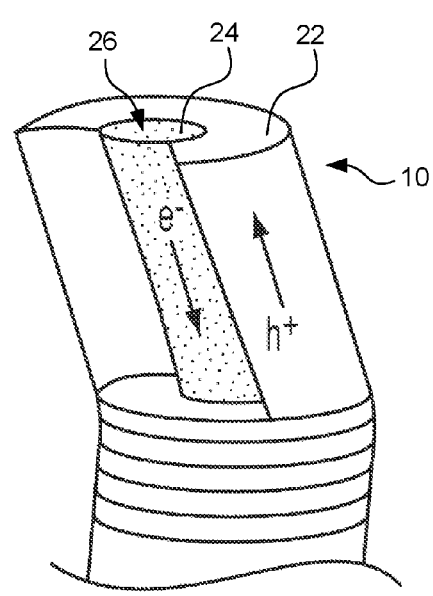
FIG. 1B is an enlarged view of one stack showing a partial cutaway of the outer p-channel.
Figure 1C:
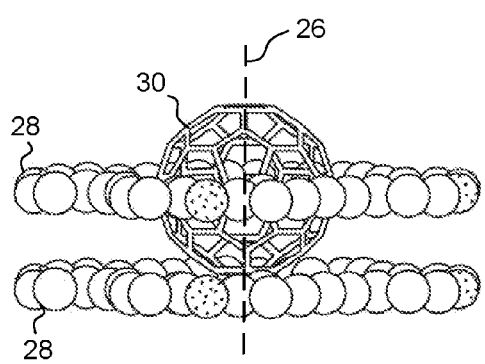
FIG. 1C is a representation of two coaxial stacked disc-shaped macrocyclic molecules (electron donor) with a single C60 (electron acceptor) oriented within an axial void.
Figure 2A:
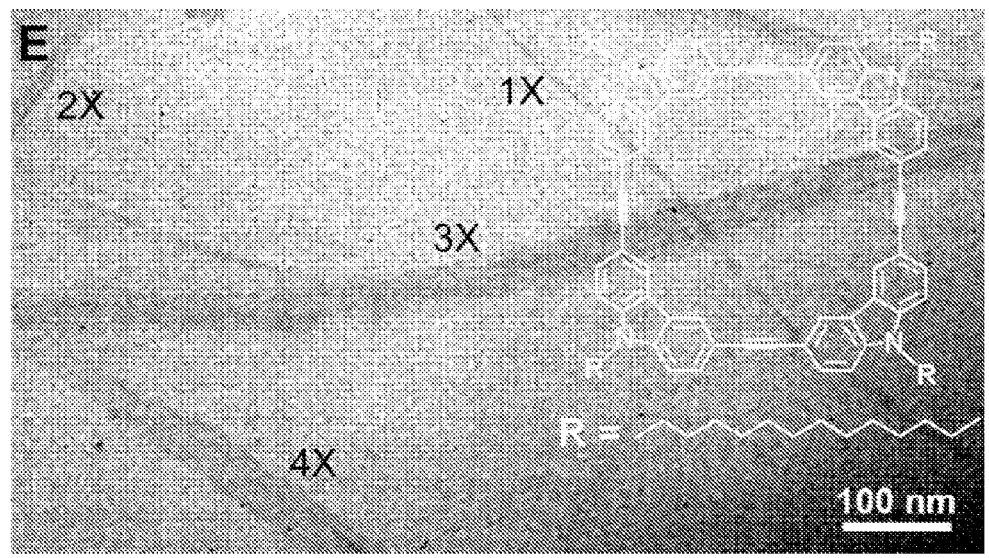
FIG. 2A is a TEM image showing the ultrathin nanofibers (diameter ca. 5 nm) formed by gelation of a tetracycle with different side-chain attachment. One-layer array consisting of different numbers (2×, 3×, 4×) of parallel aligned fibers was observed.
Figure 2B:
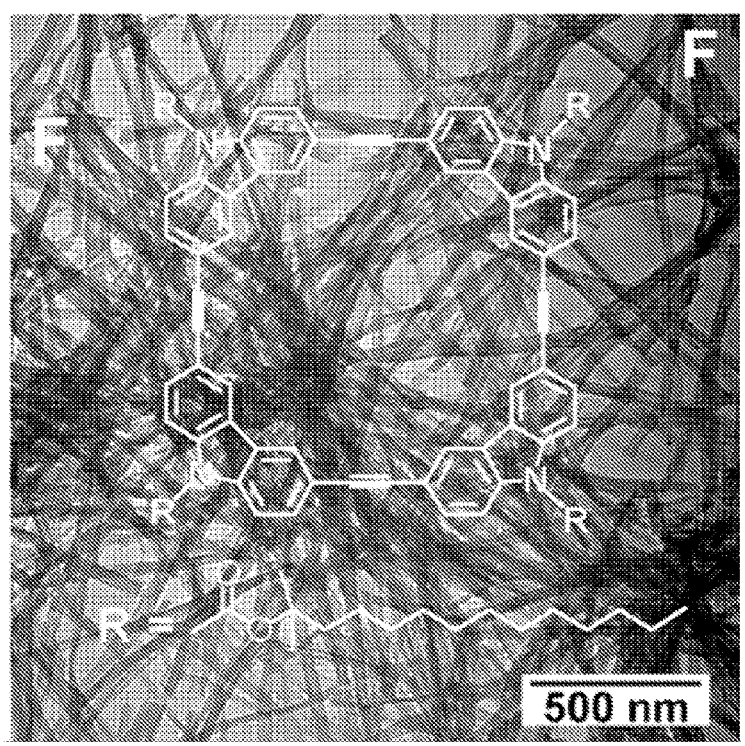
FIG. 2B is a TEM image of the nanofibers self-assembled from a tetracycle that is modified with co-planar side-chains. Totally planar molecular geometry is highly favorable for cofacial stacking and thus 1D molecular assembly.
Figure 2C:
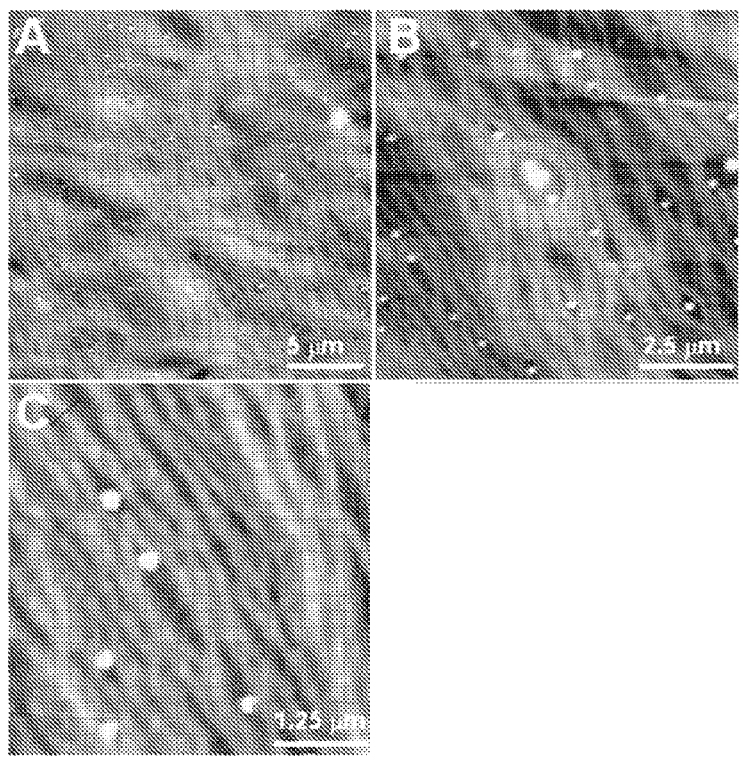
FIG. 2C is an atomic force microscopy (AFM) images (panels A-C) of the nanofibers self-assembled from a hexacycle. The array of fibers are fabricated from a 1.0 mM solution of the hexacycle in toluene heated at 80° C. for 5 minutes and 10 drops of hot solution spin-coated at the speed of 1500 rpm onto glass substrate.
Figure 2D:
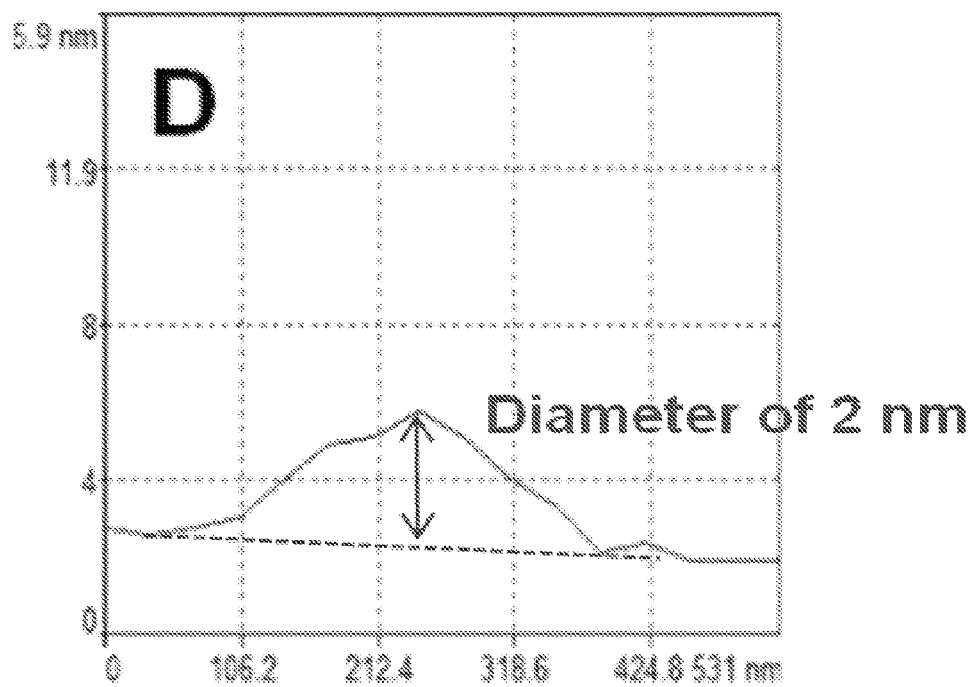
FIG. 2D is a graph of the Z-height of AFM scanning which indicates the diameter of a single nanofiber is only around 2 nm, corresponding to cross-section of fiber consisting of only one molecule. The stacks thus exhibit lateral association of side chains perpendicular to the π-stacking direction.

As illustrated in FIG. 1B, each stack can have an outer p-channel 22 and an inner n-channel 24 to provide a charge transport for photocurrent between the first and second electrodes. The outer p-channel 22 can include a plurality of macrocyclic π-conjugated planar molecules stacked through columnar self assembly to form the outer p-channel of the nano-composite coaxial cable 10 and having an axial channel 26 therein. The inner n-channel 24 can include a plurality of C60 molecules positioned coaxially within the axial channel 26 of the stack 10 to form the inner n-channel 24. Coaxial arrangement can be linear such that a single C60 molecule spans the channel along its length, as well as clusters arranged about or along the channel axis (i.e. individual C60 molecules can lay off axis but still within the axis of the n-channel). FIG. 1C illustrates a segment of one stack showing two planar macrocyclic molecules 28 having a single C60 molecule 30 centrally oriented within the axial channel. Collectively, the plurality of stacks form an ordered heterojunction to provide charge transport of photocurrent in the photocurrent generation device. With coaxial cables oriented substantially parallel to the thickness direction, these organic materials can have unprecedented efficiencies for the generation of photocurrent. As illustrated in each of FIGS. 1A and 1B, the stacks 10 are not always perfectly linear and can exhibit bends due to offsets during stacking of the planar macromolecules. Such offset can depend on the specific molecules which are described in more detail below. Despite such minor deviations from linear stacks and associated deviation from exactly perpendicular orientation to the electrodes, such stacks are considered substantially parallel to the thickness direction of the device (i.e. substantially perpendicular to the electrodes).

The nano-coax cables are based on disc-shaped macrocyclic molecules that spontaneously associate with C60 and co-assemble into columnar arrangements driven by strong π-stacking interactions. These discrete macrocyclic structures can be prepared via efficient organic synthesis, yet they are highly engineered to possess strong chemical interaction and complementary geometry with C60. Moreover, the macrocycle's covalent architecture serves as a scaffold on which electron donor (D) moieties are appropriately positioned such that the final assembled state produces spatial segregation among the donors and acceptors (here the C60) into a complementary pair of p- and n-channels, with no intermixing. The result of this nanoscale demixing is a large-area heterojunction interface throughout the material (i.e., a "bulk-heterojunction"). The elegance of this approach is that nano-coax cabling results from simple combinations of readily available components without the need to pre-synthesize acceptor-bound macrocycles. The tunability of the macrocyclic chemistry enables the identification of a large number of structures from which a set of molecular design rules for nano-coax fabrication can be developed.

Although other macromolecules can be used, the macrocyclic π-conjugated planar molecule can be an arylene-ethynylene macrocycle (AEM). In one aspect, the AEM molecule is formed of a fully conjugated tetracycle containing four porphyrin chromophores. In another aspect, the AEM molecule is formed of thiophene containing macrocycles. Other non-limiting examples of macrocyclic π-conjugated planar molecules can include toroidal graphenes, porphyrin tetracycles, thiophene macrocycles, and the like. Generally, the macrocycle can include planar cyclic molecule having an interior void large enough to allow at least one C60 molecule to be oriented therein. The macrocycle can also include peripheral side groups that can affect solubility and/or stabilize cofacial stacking. In one aspect, the planar cyclic molecule core can be formed of a plurality of planar sub-units which are either directly linked together or linked by linking groups. Non-limiting examples of planar sub-units can include carbazoles, benzenes, thiophenes, phenylene vinylene, porphyrins, phthalocyanines, perylene, pyrenes, graphenes, and combinations thereof. These sub-units can optionally be grouped into oligomers (dimers, trimers, tetramers, pentamers, hexamers, etc) such that cyclization results in multiple repeating oligomer units.

Linking groups can be used to create the macrocyclic structure and maintain planar configuration. The linking groups can be triple or double bonds directly between sub-units and can optionally include planar linking groups such as phenylene, biphenylene, amine, thiol, carbonyl, and the like. Using more than one linking group between one or more sub-units can allow for increasing the void size to accommodate additional C60 molecules as part of the n-channel.

As mentioned previously, the macrocycles can include peripheral side units (e.g. most often associated with each sub-unit). Depending on the particular system (i.e. manufacturing conditions, sub-units, etc), the peripheral units can be chosen to provide solubility in the solutions used for self-assembly processing, allowing for cofacial stacking without significant steric hinderance on the stacking and disturbing the p-channel function of the macrocycle (i.e. not strongly electron withdrawing groups). Non-limiting examples of suitable peripheral side units include C1-C10 alkyls (propyl, butyl, pentyl, hexyl, etc), carboxyls, polyalkylene glycols (e.g. polyethylene glycol, polypropylene glycol), triphenylamines (including alkoxy substituted triphenylamines), combinations thereof, and the like. Branched side-chains can be suitable as they generally introduce some steric hinderance, but provide better solubility. Although in the case for larger macrocycle molecules, branched side-chains provide improved solubility, the cofacial stacking can still be maintained due to large π-surface (i.e. enhanced π-π interaction). Thus, steric hinderance can be balanced with solubility, as long as stacking is maintained.

Unique features of these macrocyclic structures include a large, planar π-surface, shape-persistence, cyclical π-conjugation, and functionality that facilitate effective electron transfer. Large planar, shape-persistent molecular surfaces can promote π-stacking, favorable intermolecular overlap, and strong intermolecular interactions. Extended cyclical π-conjugation and redox activity can provide structures that exhibit a combination of intra- and intermolecular charge transport. A number of example macrocyclic molecules are illustrated throughout FIGS. 2-9, although variations of these configurations can be obtained using corresponding precursors having different sub-units, linking groups, and/or peripheral groups.

Typically, the plurality of macrocyclic π-conjugated planar molecules can be configured to self assemble through π-π stacking. A ring size of the plurality of macrocyclic π-conjugated planar molecules can be enlarged by adding conjugate units into a phenylene precursor between a carbazole and a triple bond, with the enlarged ring size operable to encapsulate clusters of C60 molecules. Most often, clusters of C60 molecules can include from 2 to 10 molecules.

Exciton disassociation can be configured to occur at a site of photo-excitation through expedient intermolecular electron transfer in the stack.

In one specific embodiment, the device can be configured as a solar cell. When configured as a solar cell, at least one of the first and second electrodes can be a transparent electrically conductive material, e.g. an indium tin oxide (ITO) coated glass.

The first and second electrodes can be formed from any suitable conductive material such as, but not limited to, conductive metals, polymers or composites. Specific examples of suitable materials include calcium, indium, aluminum, tin, silver, copper, gold, and combinations thereof. In one aspect, the first electrode can have a different work function from the second electrode sufficient to enable electrons to migrate to one of the first and second electrodes (i.e. the material with lower work function) and holes to migrate to the other of the first and second electrodes (i.e. the material with a higher work function). For example, the work function of aluminum is 4.3 eV and that of ITO is 4.7 eV, producing a difference of 0.4 eV. As a general guideline, a work function difference of at least 0.2 eV and in some cases up to about 1.0 eV or more. The p-n junction in these devices is established based on intermolecular donor-acceptor (charge separation) system, which produces charge separation upon illumination. The direction of charge migration along the stack as described is driven by the relative work function of the two electrodes.

The plurality of stacks located between the first and second electrodes can each be insulated from adjacent stacks by interdigitated alkyl side-chains to the macrocyclic molecules forming the outer p-channel to substantially prevent inter-stack charge recombination and current leakage.

Further, the specific dimensions of the plurality of stacks can be varied based on the particular design. However, the plurality of stacks can have an average length sufficient to substantially completely absorb light waves in the visible, infrared, and/or ultraviolet spectrum, especially in solar cell embodiments. Generally, such a length is about 100 nm to about 500 nm.

In one alternative aspect, the plurality of stacks can form a large-area homeotropic film of reduction-oxidation active donor/acceptor supramolecular stacks. Such a film can be particularly suited for use as a solar cell or as a thin film transistor (e.g. for a display) or a large area LED. As a general guideline, a large-area film is any which exceeds about 1 cm$^2$, and in some cases greater than about 10 cm$^2$.

The resulting nanostructured thin films are uniquely multifunctional, combining the properties of efficient exciton dissociation, and efficient charge transport and collection. Cyclical π-conjugation of the macrocyclic electron donors facilitate efficient delocalization of the cationic charge, thereby stabilizing a photo-induced charge-separated state to minimize losses by electron-hole recombination. Strong π-π stacking of the macrocyclic discs along the columnar axis give rise to efficient and concurrent transport of electrons and holes along the n- and p-channels, respectively (FIG. 1A).

Due to intrinsic difference in work function between the top and bottom electrodes, electrons and holes migrate toward opposite electrodes, leading to photocurrent production. Individual columns are separated by molecular insulation in the form of interdigitated alkyl side-chains, preventing intercolumnar charge recombination or current leakage. Exciton diffusion, the usual bottleneck of efficiency for double-layered and even some bulk-heterojunction solar cells, is not a problem here since the exciton dissociation occurs right at the site of photoexcitation through expedient intermolecular electron transfer. Consequently, coaxial nanostructured films can be sufficiently thick to absorb all incident light, potentially leading to an increase in photoconversion efficiency. Combination of these unique features will afford exceptional photovoltaic performance while still enjoying the ease of processing and fabrication expected for the organic-based materials.

Methods of Forming the Photocurrent Generation Device

The stack-electrode sandwich structure can be formed using any suitable approach. Generally, the macrocyclic π-conjugated planar molecules can be prepared with suitable moieties to obtain the inner and outer channel properties as more fully described below.

Successful fabrication of 1D nanostructures through π-π stacking of rigid, planar macrocyclic molecules can be extended to form a film having an array of nanostructures (FIG. 1A). Self-assembling methodologies have been developed, including both solution and surface based approaches, to fabricate well-defined nanowires with controllable sizes (5-200 nm) and morphologies (rod vs. belt) from various building blocks, such as derivatives of perylene and arylene-ethynylene macrocycle (AEM). Through a combination of novel molecular design (as described above) and exquisite supramolecular assembly processing, the 1D molecular stacking can be controlled with minimal lateral offset, leading to extended channels for efficient charge separation and transport.

Upon modification with electron donor moieties, AEMs and the analogous macrocycles provide building blocks to be complexed with C60 to form molecular p-n junctions, i.e., donor-acceptor (D/A) host-guest supramolecular structure. The efficient photoinduced charge separation between the D and A units, together with the potentially effective 1D stacking of the disc-shaped macrocycle, enables lateral assembly of the 1D stacks fabricated as a new type of solar cell materials.

Efficient 1D charge transport enables fast charge collection at electrodes, and meanwhile reduces the charge recombination between anionic radical of the acceptor and the cationic radical of the donor within the nano-coax (FIG. 1). Assuming that the individual nano-coaxes are insulated from each other (i.e., no cross-column charge leaking), the efficient charge transport enabled by the $\pi$-$\pi$ stacking will make the thin film fabricated from the nano-coax arrays an ideal photovoltaic module.

Molecular Synthesis.

Figure 3A:
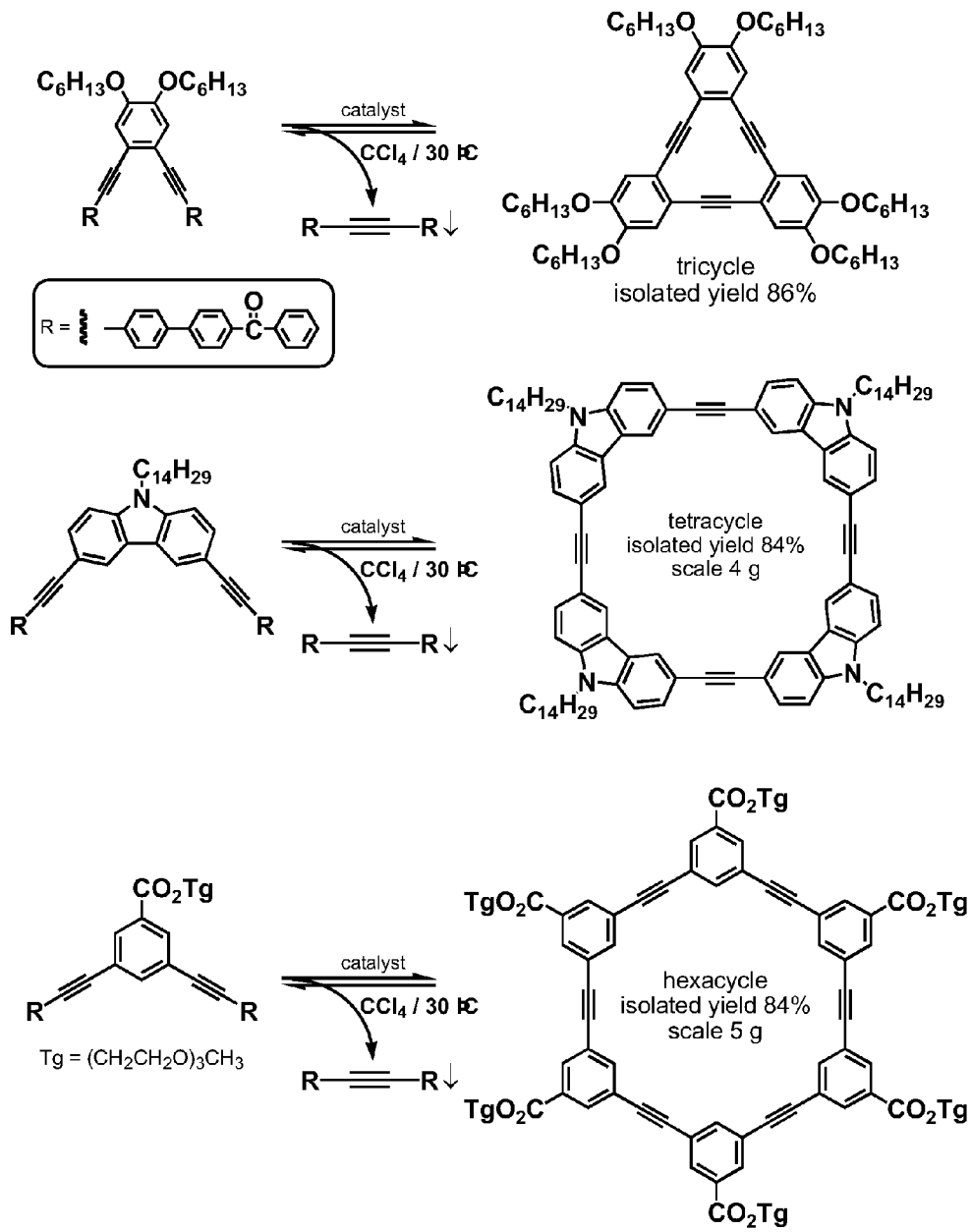
FIG. 3A is an illustration of representative examples of precipitation driven cyclooligomerization of simple precursors leading to high yields of arylene-ethynylene macrocycles (AEMs).
Figure 3B:
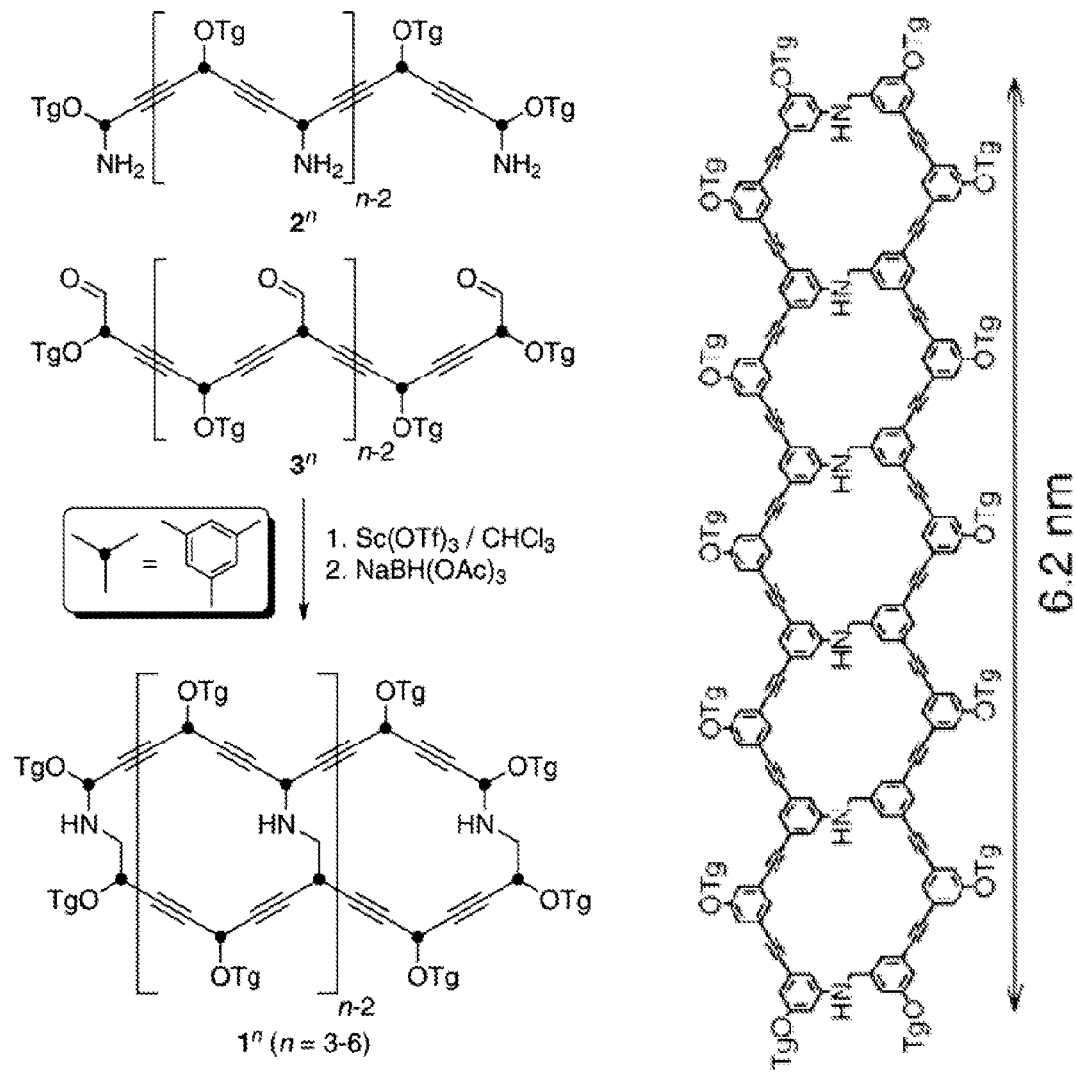
FIG. 3B is a reaction scheme for forming (n)-rung molecular ladders (n=3-6) usable as the macrocyclic molecules at least partially preformed in adjacent positions. This process is via imine formation/exchange between two discrete, complimentary m-phenylene ethynylene oligomers.

Multigram quantities of shape persistent macrocyclic can be produced in one step from simple precursors (FIG. 3). The approach relies on reversible alkyne metathesis to generate predominately a single cyclooligomeric product. Developments leading to this breakthrough were the preparation of functional-group tolerant yet highly active alkyne metathesis catalysts and the use of an insoluble byproduct to drive the cyclooligomerization process. Specific steps to produce these types of cyclic materials can be found, for example, in Zhang, W. & Moore, J. S. Arylene Ethynylene Macrocycles Prepared by Precipitation-Driven Alkyne Metathesis, J. Am. Chem. Soc 126, 12796 (2004); Zhang, W. & Moore, J. S. Reaction Pathways Leading to Arylene Ethynylene Macrocycles via Alkyne Metathesis, Journal of the American Chemical Society 127, 11863-11870 (2005); and Zhang, W. & Moore, J. S. Shape-persistent macrocycles: structures and synthetic approaches from arylene and ethynylene building blocks (a review), Angew. Chem., Int. Ed. 45, 4416-4439 (2006), each of which is incorporated herein by reference. As can be seen in FIG. 3A, the process is general for a variety of functionalized AEMs having a range of sizes and shapes. Mechanistic studies demonstrate that macrocycle formation is a thermodynamically controlled process. Thermodynamic stability is balanced by the entropic drive to incorporate the smallest number of monomer units per macrocycle against the enthalpic drive to minimize angle strain. Strong $\pi$-$\pi$ interaction leads to self-assembly of the macrocyclic molecules into 1D nanotubes, with continuous porosity along the rod axis depending on the specific materials. This and the related cyclooligomerization processes can be accomplished in order to construct larger toroidal discs for enhanced $\pi$-$\pi$ stacking and host-guest complexation with C60. Indeed, a series of ladder-like macromolecules with increasing sizes can be synthesized, as illustrated in FIG. 3B. The synthesis can be based on just one-step coupling, enabling large scale production of the compounds, as will be discussed below.

Figures 4A, 4B:
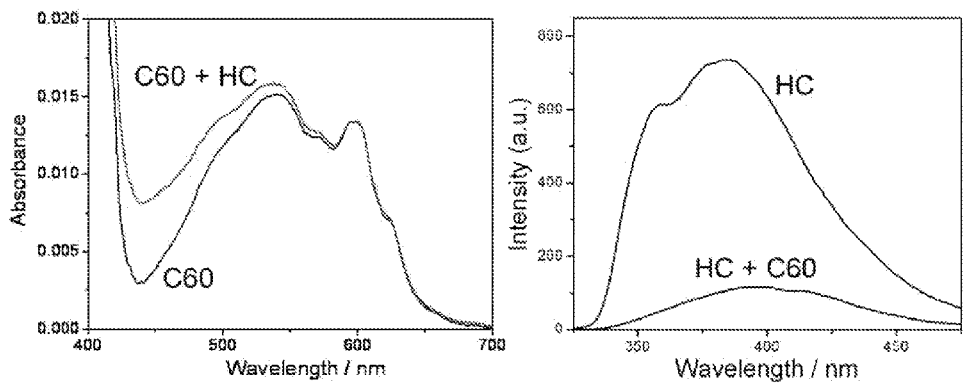
FIG. 4A is a graph of absorbance versus wavelength for associated hexacycle (from FIG. 3A) and C60.
FIG. 4B is a graph of emission intensity versus wavelength for associated hexacycle (from FIG. 3A) and C60, for which the decreased emission intensity indicates the photoinduced electron transfer from hexacycle to C60.

Strong host-guest association between macrocyclic molecules and C60 contributes to efficient electron transfer leading to charge separation between the two, and also for the 1D coaxial stacking of the host-guest system leading to formation of a supramolecular nano-coax assembly shown generally in FIG. 1A. Such molecular association for various macrocyclic molecules has been characterized using UV-vis absorption methods. For example, the hexacycle (HC) molecule shown in FIG. 3A, a dramatic color change was observed when mixed with C60 as illustrated in FIGS. 4A and 4B. Since the solution of HC itself is colorless (only absorbing in the UV region), an observed color change of C60 solution from purple to brown indicated the formation of host-guest complex between HC and C60. This is consistent with the absorption spectral measurement as shown in FIG. 4A, for which an increased absorption around 450 nm was observed. The new absorption thus emerged is likely due to the charge transfer band formed by the strong interaction between C60 and HC. The increased absorption in the visible region can lead to enhancement in harvesting solar energy, and thus the power conversion efficiency of the solar cells fabricated from these materials. Similar host-guest association between C60 and macrocycle molecules disclosed herein.

The device in FIG. 1A uses efficient photoinduced charge transfer between the donor and acceptor components (i.e. macrocyclic and C60 molecules), to afford high efficiency of light-to-electricity conversion. Such efficient charge transfer is supported by fluorescence quenching of macrocyclics by C60, as shown in FIG. 4A. When mixed with C60 at a 1:1 molar ratio in a solution (50 μM HC in toluene), the fluorescence emission of AEMs (e.g. the hexacycle and tetracycle shown in FIG. 3A) was significantly quenched. The observed efficient fluorescence quenching is due to the photoinduced electron transfer between AEM and C60, which is consistent with the coherent charge-transfer association as evidenced above by absorption spectrometry (FIG. 4A).

These macrocyclic $\pi$-conjugated planar molecules can be self-assembled into arrays of parallel nano-composite coaxial cable stacks. Generally, the self-assembly can be performed directly on one of the two electrodes. However, a sacrificial substrate can also be used to provide alternative assembly surfaces. The second electrode can then be formed over the assembled stacks.

More particularly, a method of forming a nano-composite coaxial cable for use in a solar cell can comprise coating a first electrode with a substantially continuous film formed of stackable macrocyclic $\pi$-conjugated planar molecules forming a plurality of stacks. Each stack can have an outer p-channel and an axial channel substantially perpendicular with a plane of the first electrode. A plurality of C60 molecules are also positioned coaxially within the axial channel (e.g. as part of the self-assembly process) to form an inner n-channel that forms a bulk heterojunction with the p-channel. A second electrode can be coupled with the coaxial stack film opposite the first electrode. Desirably, the second electrode can be substantially parallel with the first electrode.

Figure 5:
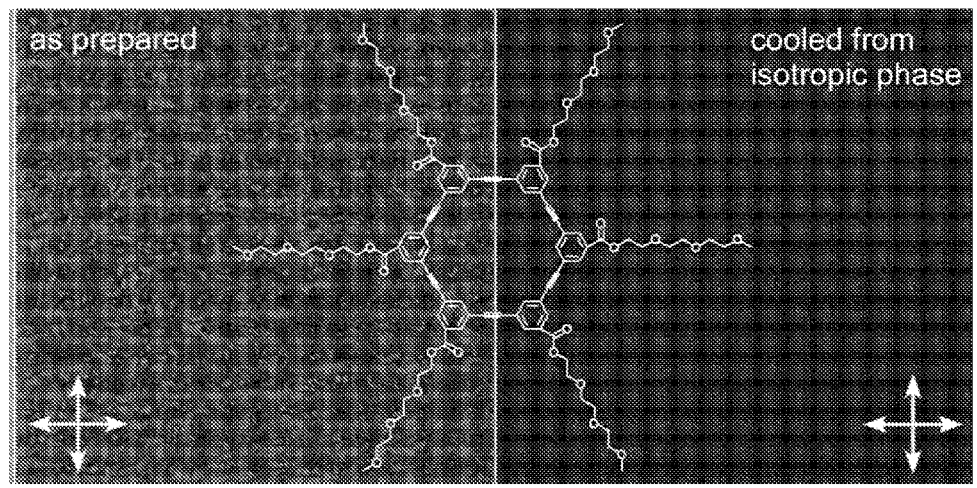
FIG. 5 is a cross-polarized optical micrograph of (left) an as-prepared film drop-cast from a toluene solution (2 mM) of the AEM molecule; (right) heating up the film into isotropic phase and cooling back to room temperature forms homeotropic phase. A low mag objective (20×) was used for large area imaging.

In one aspect, a homeotropic film can be formed by heating the continuous film formed of the AEM molecules above a selected temperature to form an isotropic phase in which the AEM molecules in the film are homogenously oriented. The film can be cooled to room temperature at a rate sufficient to allow the isotropic phase to rearrange into a homeotropic phase to form a large area homeotropic phase in the continuous film. FIG. 5 are optical micrographs of a hexacycle which was drop cast into a film from a 2 mM solution before (left) and after (right) heating the film into the isotropic phase and cooling back to room temperature to obtain an oriented film.

In one alternative aspect, the homeotropic film can be formed via spin coating, although other methods can also be suitable such as, but not limited to, physical vapor deposition, chemical vapor deposition, and the like. In one optional aspect, a solar cell design can include pre-coating a glass substrate with a conductive coating prior to forming the homeotropic film. For example, an indium tin oxide (ITO) coating can be formed on the glass substrate such that the ITO will be in contact with the homeotropic film upon deposition of the same.

Homeotropic film fabricated from a planar AEM modified by oxygen-rich side-chains.

In addition to the highly organized π-π stacking (favorable for efficient charge separation and transport), alignment of the nano-coaxial columns perpendicular to the electrode surface (as shown in FIG. 1A) also contributes to an efficient solar cell. Vertical alignment enables the shortest path for charge migration and maximal terminal contact of nano-coax with the electrode, and thus enhances the charge collection at electrodes. The fabrication of highly organized homeotropic films can be formed in which the nano-coaxial stacks are laterally arranged in a way with the long axis perpendicular to the electrode substrate. Such homeotropic films are highly suited for being sandwiched between two electrodes to fabricate efficient photovoltaic cells. In one embodiment, the thin films of a hexacycle AEM can be fabricated on glass, as shown in FIG. 5. The totally planar configuration, together with the oxygen-rich side-chains (which enhance the molecular interaction with hydrophilic surface like glass), enables effective π-π stacking to form a film having a homeotropic phase. Non-limiting examples of such oxygen-rich side-chains can include polyalkylene glycols (e.g. polyethylene glycol, polypropylene glycol). Drop-casting a 2 mM toluene solution of the AEM molecule onto glass can produce a continuous film, although the fast evaporation can lead to distorted orientation of the columnar stacking, i.e., the long axis of the nano-coax may not be perpendicular to the glass surface. This can be evidenced by the significant birefringence observed for the as-prepared film under a cross-polarized microscope (FIG. 5, left). Upon heating above 250° C. the film can became an isotropic phase, in which molecules are homogeneously oriented, resulting in no birefringence. Cooling the film slowly (5° C./min) to room temperature leads to the formation of a large area homeotropic phase, as shown by the dark image (no birefringence) obtained under the same cross-polarized microscopy (FIG. 5, right). A homeotropic film can be easily fabricated using a structurally optimized molecule. In another embodiment, a homeotropic film can be fabricated onto an ITO substrate. The ITO substrate can be employed as the transparent electrode in a solar cell.

Synthesis of various π-conjugated macrocycles suitably functionalized with electron donor groups, and programmed via shape and π-stacking interactions to favor columnar self-assembly.

These large and functional molecules can be synthesized by employing simple, efficient, and scalable synthetic routes, often just one step synthesis from the precursor as illustrated in FIGS. 3A and 3B. The molecular design and synthesis impact structural factors of macrocycles that can affect the molecular organization and the optoelectronic properties of materials. To that end, the molecules are designed to provide the following advantages.

1. Enlarged π-systems for enhanced molecular stacking and light absorption: Large supramolecules in planar π-conjugation are highly favored for cofacial π-π stacking and thus for the 1D columnar assembly. The extended π-conjugation (coupled with the strong intermolecular π-π interaction) enhances the visible absorption, leading to increased light harvesting.

2. Highly tunable structure, geometry and redox property suited for charge generation, transport and separation: Generally, AEM molecules possess high tunability and adaptability in structure, geometry, size and reduction-oxidation properties, providing enormous options for optimizing the columnar stacking and the optoelectronic properties. The macrocyclic molecules are designed to be multi-functional: 1) with strong reducing capability to initiate photoinduced electron transfer (exciton dissociation) with C60; 2) with highly conjugated structure for effective intramolecular π-delocalization to stabilize the cationic radical (the trapped hole); and 3) with rigid, planar or nearly planar conformation for effective intermolecular π-π interactions to produce strong, organized molecular stacking incorporating C60 within the axial channel. The versatility of AEM syntheses can allow customization of variation to optimize the molecular functions desired for efficient charge separation and stabilization.

3. Highly adaptive peripheral side-chain modification: Side-chain modification plays a vital role in improving molecular self-assembly processing. Appropriate side-chain attachments are used to provide sufficient solubility for solution processing, while still maintaining the desired π-stacking propensity. Strong side-chain interaction enables lateral association between columnar mesophases, thereby avoiding the formation of pinholes in the film (which leads to short circuit when depositing the metal electrode). Indeed, continuous 2D networks have been fabricated with AEMs through interchain hydrogen bonding or hydrophobic associations. In general, totally planar molecular configuration enhances the interchain hydrophobic interaction, leading to strong lateral interdigitation between the columnar stacks, which favor a sustainable homeotropic phase of films, highly desirable for solar cell devices.

The synthesis and self-assembling of molecules can be accomplished with small, monocyclic AEMs (e.g. tri-, tetra-, hexa-cycles), which normally have higher solubility for convenient solution processing. Homeotropic films can be fabricated from these molecules for the optoelectronic optimization and solar cell applications as described herein.

The frames of macrocyclic molecules can be made to form much larger nanotubular compartments, thereby accommodating clusters of fullerenes rather than simple linear chains of C60. A stack of macrocyclic molecules having a larger axial channel with a cross section length equivalent to the width of multiple-C60 molecules can provide improved electrical contact for charge carriers, and more importantly will tolerate lateral offset of the π-stacking of macrocycles, whereas a single C60 strand may have breaks or discontinuities due to defects.

Figure 6A:
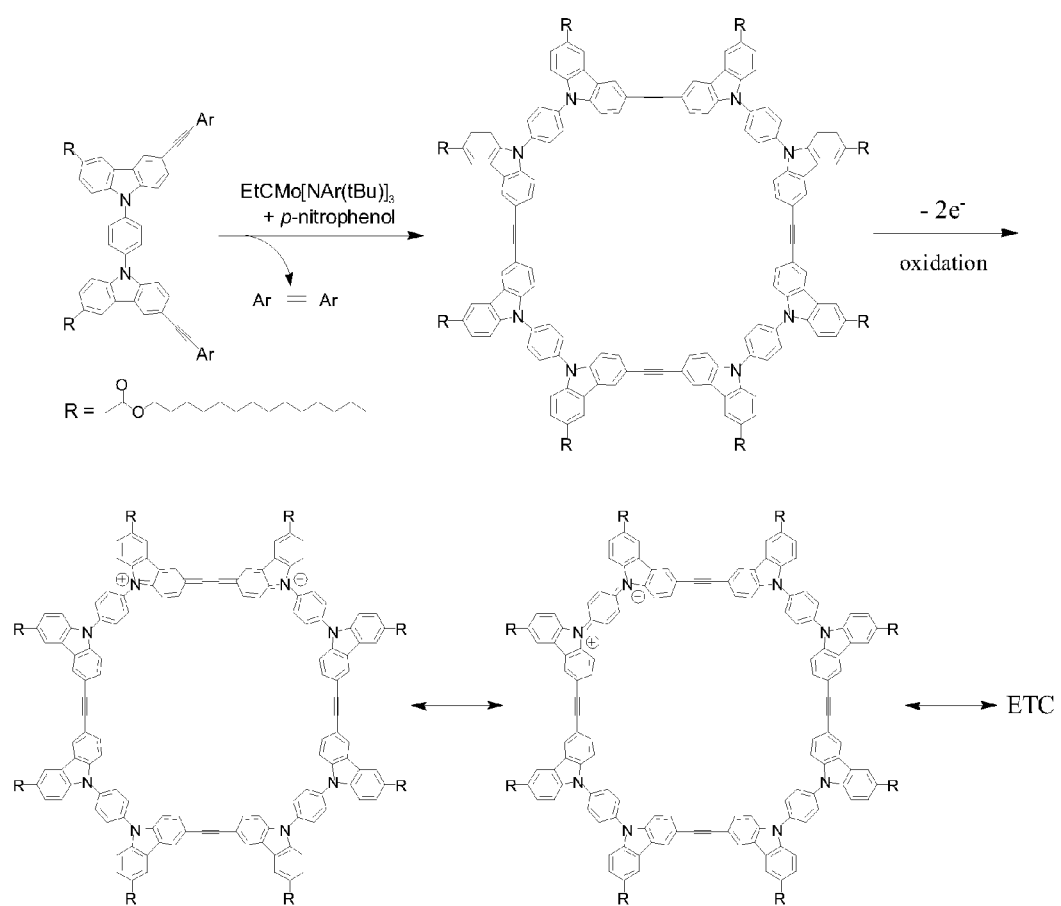
FIG. 6A provides an illustration of larger AEM molecules that provide a larger void area for hosting multiple C60 molecules within the void. This AEM molecule uses carbazoles directly linked via triple bonds and via phenylene linking groups.

FIG. 6A shows one type of π-conjugated, redox-active monocyclic structure that can serve as a building block for manufacturing nano-coax stacks having semiconductor characteristics. This particular macrocycle includes carbazoles linked by both phenylene linking groups and triple bonds. Carbazole containing AEMs demonstrate efficient photoinduced electron transfer to electron-deficient molecules (electron acceptors), making them suitable candidates for fabrication with C60 as active photovoltaic materials. The synthesis shown in FIG. 6A exemplifies a strategy of deriving complex products from simple synthetic routes. The synthetic approach expands the one-step alkyne metathesis cyclooligomerization described above.

Figure 6B:
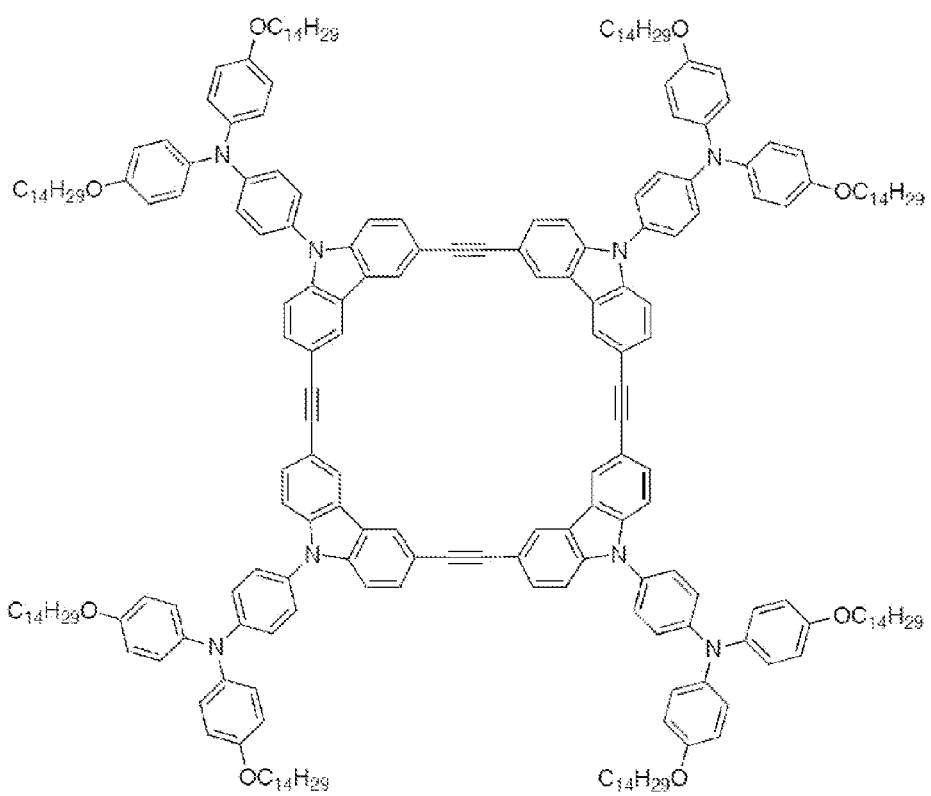
FIG. 6B illustrates an AEM containing carbazole as the conjugation unit that has been synthesized. This molecule provides enhanced electron donating capability and visible absorption desirable for solar cell applications.

Once soluble versions of these monocycles are prepared, their solution electrochemistry can be assessed by cyclic voltammetry. Two-electron oxidation of the phenylene-dicarbazole molecule can produce a stable dication that exhibits π-delocalization over the entire macrocycle (FIG. 6A). When the molecules are packed into a columnar arrangement, further delocalization along the stacking direction is expected. FIG. 6B illustrates a carbazole tetracycle directly bonded via triple bonds and including triphenylamine peripheral groups (e.g. $OC_{14}C_{29}$, although other alkyoxy side groups can be suitable such as, but not limited to, methoxy to nonoxy and $OC_{10}H_{21}$ to $OC_{14}C_{29}$).

Figure 7:
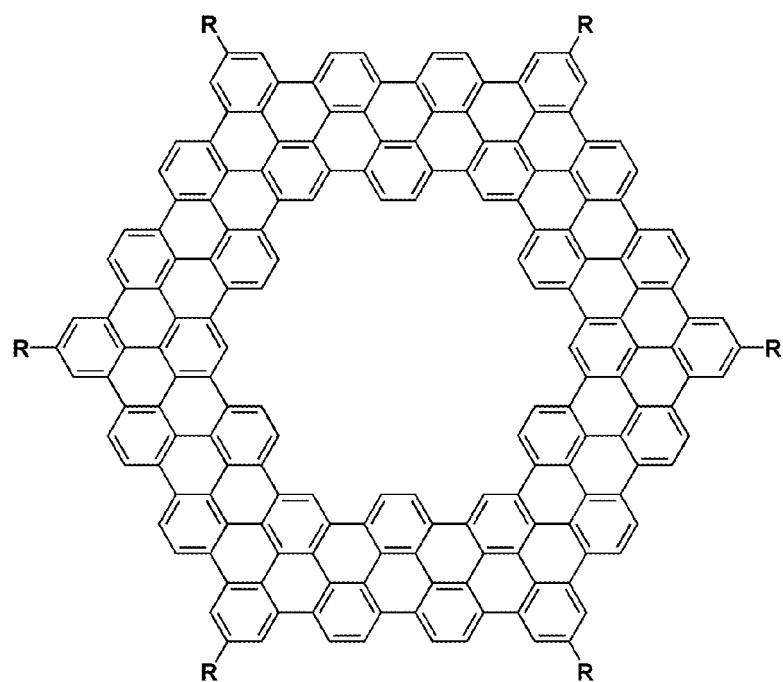
FIG. 7 illustrates a toroidal graphene molecule in a substantially planar geometry, showing how appropriate selection of an R-group enables sufficient solubility while maintaining a cofacial π-π stacking propensity.

Strength of π-π stacking is strongly dependent on the area of molecular contact between aromatic systems. Large-area π-stacking has been widely used for discotic liquid crystals, where the columnar organization dominates the phase behavior. A toroidal graphene-type molecule can be synthesized and used for the coaxial assembly with C60. The synthesis can be carried out using a modular building-block approach involving oligophenylene precursors. One example of a toroidal graphene is shown in FIG. 7. The necessary oligomers can be synthesized by iterative methods. For example, Suzuki-Miyaura cross-coupling and C—H activation chemistry can be used for expeditious synthesis of the oligophenylene precursors. Chemically-based oxidants, such as those typically employed for the Scholl reaction, can also be used (For details, see two articles by Moore: Angew. Chem., Int. Ed. 45, 4416-4439 (2006); Acc. Chem. Res., 1997, 30 (10), pp 402-413, which are both incorporated herein by reference). Alternatively, the use of electrochemical routes can be used to bring about the oxidative stitching reactions. The electrochemical route can be advantageous for 2D fabrication and can capitalize on a much higher degree of fine-tuning without unwanted byproducts from chemical oxidants. Dynamic covalent coupling conditions can be important for achieving long-range order and such conditions can be used through either the chemical or electrochemical oxidative routes.

The enlarged graphene-type π-surface can help tolerate the lateral stacking offset that is often observed for columnar stacking of planar disc-like molecules. Moreover, the expanded π-system can also enhance the intramolecular π-delocalization, helping stabilize the charge separation with C60, and leading to increased photoconversion efficiency. The reaction scheme depicted in FIG. 6 is one example of an electron rich aromatic precursor used to form an ethenylene linked macrocycle. As can be seen in this example, the precursor is a planar body when the single bonds are rotated to align. Upon formation of the macrocycle, these aromatic groups align along a common plane due to rotation around single or triple bonds. The planar configuration of such macrocycles can be either guaranteed by having only planar configurational options or confirmed by performing a suitable computational chemistry calculation for comparison of low energy states, e.g. ab initio calculations. The molecular structures can also be subjected to modification including enlarging the void size of the macrocycle by elongating the edges, e.g. by choice of the precursor and/or linking groups. Enlarged void space enables encapsulation of clusters of C60 rather than a single C60, leading to formation of a core-axis with multiple-C60 cross-section, which (as mentioned above) helps minimize the potential electrical breakup within the single-strand C60 line.

Compared to the macrocycles of smaller π-surfaces, these large-size shape-persistent objects are expected to yield much enhanced cofacial π-π stacking, leading to the formation of a highly organized homeotropic phase as previously evidenced for other large discotic molecules. The extended π-conjugation will also enable strong spectral response in the visible region, as evidenced for perylene and other polycyclic aromatic hydrocarbons, and such visible response will be further enhanced by stacking into a solid state.

Figure 8:
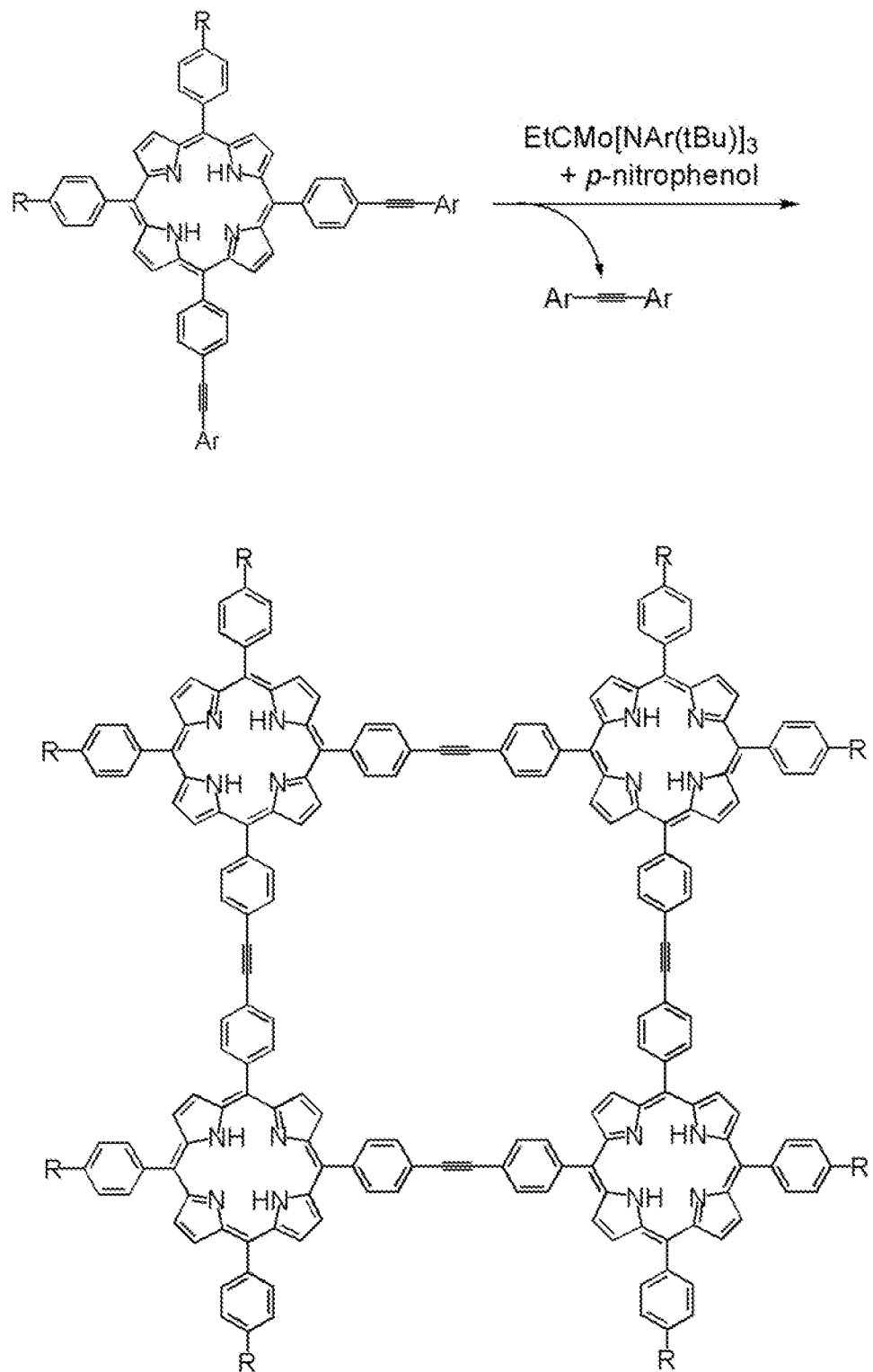
FIG. 8 illustrates a tetracyclic supramolecule containing four porphyrin chromophores in full conjugation. Coplanar geometry was evidenced by ab initio calculation (B3LYP/6-31G*).

A fully conjugated tetracycle containing four porphyrin chromophores can be synthesized as shown in FIG. 8. Coaxial segregation of the porphyrin and C60 phases can be achieved, as depicted in FIG. 1A. These porphyrin based macrocyclic molecules possess globally planar geometry dominated by the cyclic conjugation with the four porphyrin units at corner. The planar geometry, along with the large area of molecular contact, can facilitate the cofacial π-π stacking, producing highly organized columnar molecular assembly. It is noted that when a phenylene linkage is present, the single bonds will allow rotation about a para-bonded axis with a co-planar orientation often no less preferred than a non-planar orientation. However, a twisted phenylene linkage (ca. 45° with respect to the molecular plane) should not cause significant steric hindrance for the intermolecular stacking, mainly because of the small size of phenylene ring, for which the part tilted above the molecular plane is only ca. 0.8 Å, far within the typical π-π stacking distance (3.5 Å). Indeed, many other planar molecules containing twisted phenylene linkages have been successfully fabricated into 1D nanostructures, where the columnar growth is mainly driven by the cofacial π-π stacking. Regardless, the overall macrocycle is substantially planar and can be stacked to form the coaxial arrangement described herein. Thus, any rotational behavior of various groups should be limited in dimensions to avoid disturbing the stacking performance of the macrocyclic molecule.

The result of such columnar co-assembly is the formation of continuous, segregated phases for porphyrin and C60, while the efficient photoinduced charge separation typically observed between the two can be maintained through the tight host-guest complexation. The enlarged void structure of the macrocycle illustrated in FIG. 8 can allow the incorporation of C60, taking advantage of the rigid spatial compartment, while the multiplied donor-acceptor interaction (caused by the multiple porphyrin units) can strengthen the host-guest complexation.

Solubility can be problematic for these types of macrocyclic molecules and can rectified by appropriate side-chain modification. These kinds of molecules usually have poor solubility in common organic solvents. Through appropriate side chain modification with hydrophilic peripheral groups such as, but not limited to, hydrophilic poly-ethyl glycol and hydrophobic long alkyl chain, their solubility in organic solvents can be largely improved. However, generally they still cannot be dissolved in water. These macrocyclic building blocks can be used for fabricating optoelectronic materials in a manner similar to discotic liquid crystals. One advantage of employing such a supramolecular structure in solar cell materials is the extended absorption spectra of porphyrins caused by the enlarged macrocyclic conjugation. In combination with the increased absorption caused by the charge-transfer complexation between the macrocycle and C60 (FIG. 4), the film made of this porphyrin-containing supramolecule can provide broad spectral sensitivity. Thus, the absorption spectra of the nano-coax assembly can be increased by forming macrocycles of porphyrins and further sensitized by introduction of the electron acceptor C60.

The conjugated polymers including polyphenylene vinylene and polythiophenes can be prepared as part of the coaxial assembly of the polymer and C60 phase, so that the free charges can transport in segregated channels thus formed, minimizing the charge loss due to electron-hole recombination.

Figure 9:
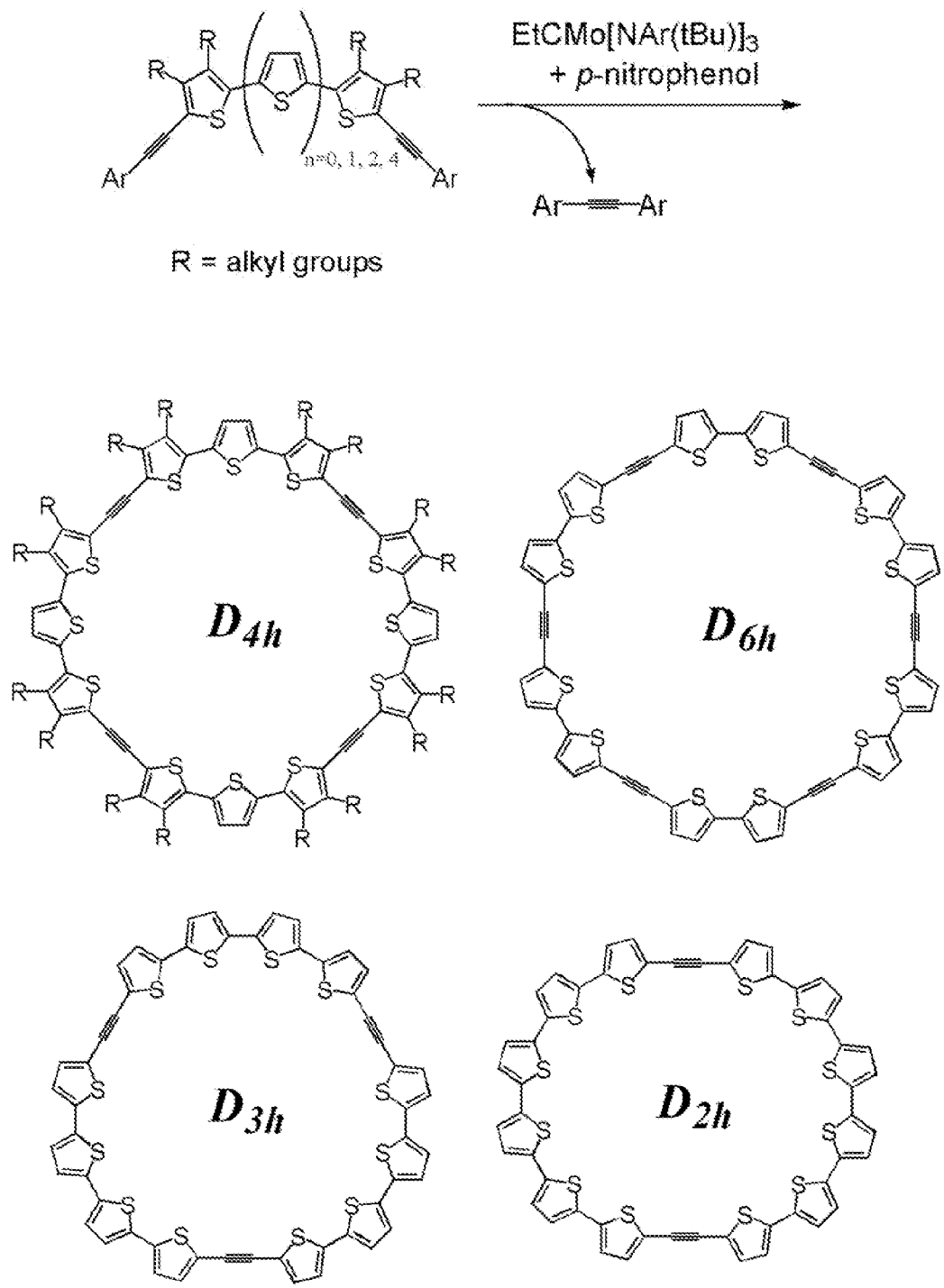
FIG. 9 provides an illustration of symmetry controlled synthesis of thiophene containing macrocyclic. Ab initio calculation (B3LYP/6-311g**//B3LYP/6-31g*) indicated coplanar conjugation for all the four macrocycles, and HOMO-LUMO gap in the range of 2.15-2.33 eV (580-530 nm). The thiophene pentamer is not suited for cyclic coupling due to mismatching geometry.

The phase segregation and organization of a nano-coax by covalently linking the thiophene oligomers into a planar, totally conjugated, shape-persistent scaffold is illustrated in FIG. 9. 1D stacking of these macrocyclic oligomers with incorporation of C60 can yield coaxial arrangement of the donor and acceptor phase, which, along with the intrinsic strong visible response of conjugated polymers, can exhibit unprecedented efficiency of photocurrent generation. Interestingly, by using different lengths of oligomers, macrocycles of varying symmetry can be prepared via the one-step alkyne metathesis as shown in FIG. 9. Different geometries provide more options for optimizing the molecular stacking and incorporation of C60, for which the intermolecular arrangement and the effect on optoelectronic properties can be compared.

Macrocycles in different sizes and geometries can accommodate C60 within the axial interior column in different packing geometry and density, yielding different strength of donor-acceptor contact between thiophene units and C60. This varying packing of C60 and electrical contact with the macrocycle shell provides a way to optimize the assembly of C60 regarding the electrical conductivity, i.e., the charge carrier mobility. Moreover, the different size of the oligomer unit, in combination with the different cyclic conjugation, can provide different absorption spectral response, particularly when assembled into solid materials, where the intermolecular π-π interaction is significantly different for the four macrocycles. Notably, all the four illustrated macrocycles contain the same number of thiophene unit (i.e. 12 total).

Similar macrocycles containing oligothiophene units (but conjugated with biethynyl linkages similar to the structures in FIG. 9 where the thiophenes are linked by one ethynyl, but with two ethynyl linkers herein) can also be synthesized, and used to fabricate highly organized two-dimensional supramolecular assembly on flat substrate. Onto the supramolecular scaffold thus formed C60 can be deposited with high position recognition, which is mainly driven by the host-guest (donor-acceptor) interaction. X-ray crystallography revealed planar geometry for these thiophene containing macrocycles. In comparison, all of the four macrocycle supramolecules shown in FIG. 9 are conjugated through single ethynyl linkage, and consequently the synthesis can be simplified to be a one-step reaction from the precursor, enabling multigram production and thus allowing for large scale materials fabrication. Moreover, all the molecules, despite varying symmetry, demonstrate the desirable planar conformation, as evidenced by the energy minimization calculation using density functional theory (DFT). The cyclic conjugation shrinks the HOMO-LUMO gap of thiophene oligomers down to the range of 2.15-2.33 eV, corresponding to an absorption maxima of 530-580 nm, which matches well with solar cells designs.

Based on the well established 1D self-assembling techniques that have been developed for rigid, planar molecules, the solution based self-assembly can be adapted to surface processing to fabricate large-area thin films in homeotropic phase where the direction of columnar stacking of discotic molecules is perpendicular to the substrate. Such homeotropic phase can be optimized by both vertical π-π stacking and lateral organization between columns. The latter, at least partially determined by the side-chain interdigitation, helps sustain the perpendicular orientation of the columnar stacking. A homeotropic film is conducive to cross-film charge transport due to the effective intermolecular π-delocalization. The short path for charge transport will also reduce the probability of charge recombination, and thereby enhance the charge collection at electrodes.

Fabrication of Thin Films Via Spin-Coating.

In accordance with one embodiment, a large area, organized film can be fabricated on the bottom electrode of a solar cell. The bottom electrode can be ITO coated glass, as previously discussed. Glass substrates are cheaply available and easier to clean by wet chemical methods. A glass surface cleaned by piranha reagent (30:70 $H_2O_2$(35%):$H_2SO_4$) showed a roughness of only about 0.8 nm, which is much smaller than the dimensional size of the molecules. Such a flat surface is highly suitable for both the surface fabrication and microscopy characterization as described below. An optimal fabrication protocol developed for a glass substrate can be adapted to ITO coated glass. The ITO surface is more hydrophobic than glass, and thus is more favorable for face-on adsorption for planar aromatic molecules due to enhanced hydrophobic interaction between molecules and the ITO surface. Moreover, the surface polarity of ITO can be adjusted over a wide range by argon or oxygen plasma treatment to accommodate effective adsorption of the molecules that may have various polarity preferences due to the different core and side-chain structures.

Spin-coating, a typical way to make films of uniform-thickness, can be employed to fabricate thin films for the host-guest systems of AEM/C60, which can benefit from precise control of molar ratio in solution processing and strict selection of solvents with appropriately balanced solubility for both of the two components. Due to relatively fast evaporation, films made by spin-coating usually possess crystalline defects caused by distorted orientation of columnar stacks or large offset of π-π stacking. To remove these defects, two approaches can be taken: thermal annealing via heating-cooling cycles, and solvent vapor annealing, both of which can promote molecular reorganization in the film. Thermal annealing takes advantage of the low melting point of liquid crystal property of the molecules with long side-chains. Heating up the as-prepared film into an isotropic phase, followed by cooling back to room temperature is usually an effective way to rearrange the component molecules in both the vertical and lateral dimensions, leading to the formation of large-area homeotropic phase, as previously discussed with reference to FIG. 5.

The second approach to structural optimization of film is based on the solvent vapor annealing technique for in situ fabricating 1D nanostructures on polar substrates. Annealing is usually performed in a closed chamber saturated with an appropriate solvent vapor. Depending on the molecular structure and the surface property, solvents of different polarity or a combination of solvents can be used. Factors that influence solvent choice include: 1) solubility in order to allow sufficient diffusion of component molecules on the surface; and 2) minimal affinity to the surface, thus allowing high mobility on the surface. Chloroform is often a good choice for polar surfaces including glass. Depending on the solvent, appropriate temperature annealing following the solvent vapor annealing can be employed to remove the trace solvents possibly trapped in the matrix, thus leading to a more tightly packed film.

Both approaches discussed above can be correlated to the individual molecular structures and configurations, which determine solubility, polarity, melting point and interfacial interactions, and thus dictate the optimization of the film processing (e.g., selection of temperature, solvent, cooling rate, etc.). Particularly, in correlation to the structural and physical characterization of the films as to be determined below, the optimized film processing will provide direct guidance for the molecular design and synthesis, leading to formulation of improved molecular design rules for film fabrication.

Fabrication of Thin Films Via Vacuum Vapor Deposition.

In addition to the wet-chemical methods described above, a physical vapor deposition (PVD) technique can also be employed to fabricate organized thin film by layer-by-layer deposition. The deposition speed can be feasibly controlled by adjusting the chamber temperature and initial vacuum (or molecular vapor pressure). One factor ruling the deposition speed is the strength of the intermolecular interaction. In case such interaction is weak or the π-π stacking is not sufficiently superior over the lateral molecular association, the deposition speed can be carefully controlled to allow sufficient time for molecules to assemble into the desired homeotropic organization.

Large-area organized monolayer of various macrocyclic molecules have been successfully fabricated by PVD methods. The lateral organization is influenced by the 2D interdigitation between side chains due to hydrophobic interactions. Using these highly organized monolayer network as crystal-growth seeds, a substantially uniform homeotropic phase film can be fabricated through layer-by-layer growth of the columnar stacking, for which the freshly deposited molecule will preferentially stack with maximal overlapping with the previously deposited molecule, leading to columnar growth perpendicular to the substrate. By adjusting the deposition speed and time, the thickness of film can be precisely controlled.

Taking advantage of the layer-by-layer growth of PVD, a seeding layer of different molecules can be employed. Considering the different surface polarity and roughness of ITO (compared to glass), the surface affinity for some of the molecules discussed above may not be sufficiently strong to form sustainable films. This is particularly true for the molecules that possess mismatching polarity and ring size with the ITO surface (typical roughness of ITO is about 1-3 nm). In such cases, a larger AEM molecule can be used with more appropriate polarity to form the seeding layer, onto which the active component molecules can be subsequently deposited. Since the film thickness can be precisely controlled by PVD, this pre-seeding technique is seen as a complementary approach to fabrication of homeotropic films. The effective electrical contact thus achieved between the seeding layer and the electrode can improve the charge injection and collection at the electrode.

Beyond the seeding with rigid AEM molecules, conducting polymers can also be used as seeds to improve the film fabrication of the hydrophilic molecules. A typical polymer that can be employed is a bipolymer blend, poly(3,4-ethylenedioxythiophene):poly(styrene sulfonate) (PEDOT:PSS), which is commercially available and has been widely used as electrode support layer on ITO in organic based solar cells. However, other conducting polymers can also be suitable. A pre-deposited thin layer of PEDOT:PSS (by high speed spin-coating) will enhance the surface affinity for the molecules of high polarity or with hydrogen bonding moieties (e.g., carbonyl and amide) within the side-chains, leading to improved electrical contact at the electrode interface. Moreover, PEDOT:PSS is highly conductive and provides an effective medium for the interfacial charge injection at the electrodes.

PVD based deposition methods are usually suited for fabricating unimolecular systems. For the bimolecular system of AEM and C60, a modified fabrication process (as described below) can be employed to afford coincident deposition of the two molecules to attain the desired host-guest organization. As previously evidenced, large-area, organized monolayers consisting of host-guest bimolecular structures of AEM/C60 have been obtained by step-by-step deposition of the two components. Such a step-by-step deposition can be adapted with improvement for repeated stacking, to fabricate multilayer thin films comprising of the same host-guest organization of AEM and C60. The strong host-guest (donor-acceptor) interaction between AEM and C60 (as evidenced in FIG. 4) can ensure the effective intercalation of C60 in the film matrix. A challenge for such multi-step fabrication is to control the monolayer (rather than multilayer) deposition in each step. Although such fabrication may be time consuming in terms of practical application, it can provide an alternative way to fabricate the homeotropic film for bimolecular D/A materials. The simultaneous deposition of both AEM and C60 can be accomplished in one chamber by controlling the alternating release of AEM and C60. This technique can benefit from a fast heating/cooling cycle of the sample source, for which a laser ablation can be used.

The solar cell can be fabricated as a conventional sandwich-like device, in which the active semiconductor film is packed between two planar electrodes, e.g. with ITO as the transparent electrode and a top-coated metal layer as the counter electrode. The intrinsic ring structure of AEM molecules will generate rugged, nanoporous films through π-stacking induced self-assembly, and the surface porousness (roughness) can be feasibly modulated by changing the ring-size of the building molecules. Such a nanoporous film will afford effective contact with the ITO surface, which has roughness typically between 1-3 nm, ideally matching the size of the AEM rings.

The same interpenetrating contact is also applicable to the top electrode deposition, for which the vapor deposition of metal atoms can fill up the voids of the top layers of films, leading to enhanced interfacial contact between the electrode and the film matrix. An effective contact between the electrode and the organic film can enable efficient interfacial charge injection, thereby enhancing the overall efficiency of photovoltaic cells.

In one aspect, the solar cell can be constructed by sputter coating a top metal electrode (typically aluminum) onto the pre-fabricated film on ITO coated glass. As mentioned above, slow metal deposition produces interpenetration between the electrode and film, resulting in effective electrical contact. Such interpenetration is limited within the top layers of the film mainly due to the cross-film space-filling caused by the rotated and offset stacking of molecules, and thus avoiding or reducing occurrence of short circuit or other electrical leaking problems. The active area of the cell can be controlled and adjusted by coating different sizes of the top electrode through a shadow mask Typically, an active area of ~10 mm$^2$ is employed.

In general, there is a tradeoff between film thickness and photoconversion efficiency for a cell. On one hand, the thicker the film, the more light will be absorbed; on the other hand, an increased thickness may increase the probability of charge recombination due to the longer path of charge transport. The thickness of film can be controlled by adjusting the spin-coating speed and/or the solution concentration, or the vapor deposition time for the film fabricated with PVD.

The second approach to optimize the cell performance is based on the selection of top metal electrodes depending on the different nano-coax composites and the various molecular structures employed. By using different metals, a wide range of work-functions (Fermi levels) of electrode can be provided, which may produce different open-circuit voltage for the cell. As previously observed for bulk-heterojunction cells, $V_{OC}$ of the nano-coax cell is likely dependent on the work-function difference ($\Delta E_F$) between the two electrodes, with slight dependence on the LUMO (and HOMO) level of the acceptor (and donor). Seven metals with dramatically different work-functions can be exploited as the top electrode, calcium (Ca, work function 2.9 eV), indium (In, 4.1 eV), aluminum (Al, 4.3 eV), tin (Sn, 4.4 eV), silver (Ag, 4.7 eV), copper (Cu, 4.9 eV), and gold (Au, 5.3 eV).

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A photocurrent generation device having a nano-composite coaxial cable structured for photocurrent production, comprising:
    a plurality of stacks located between and oriented substantially perpendicular to at least one first electrode and at least one second electrode to enable photocurrent to flow through the stacks, each stack having an outer p-channel and an inner n-channel to provide a charge transport for photocurrent between the first and second electrodes; said outer p-channel including a plurality of macrocyclic π-conjugated planar molecules stacked to form the outer p-channel of the nano-composite coaxial cable and having an axial channel therein; and said inner n-channel including a plurality of C60 molecules positioned within the axial channel of the stack to form the inner n-channel, the plurality of stacks forming an ordered heterojunction to provide charge transport of photocurrent in the photocurrent generation device.

2. The device of claim 1, wherein the macrocyclic π-conjugated planar molecule is an arylene-ethynylene macrocycle (AEM).

3. The device of claim 2, wherein the AEM molecule is formed of a fully conjugated tetracycle containing four porphyrin chromophores.

4. The device of claim 2, wherein the AEM molecule is formed of thiophene containing macrocycles.

5. The device of claim 1, wherein the macrocyclic π-conjugated planar molecules are formed of sub-units of carbazoles, benzenes, thiophenes, phenylene vinylene, porphyrins, phthalocyanines, perylene, pyrenes, graphenes, or combinations thereof.

6. The device of claim 1, wherein the plurality of macrocyclic π-conjugated planar molecules self assemble through π-π stacking.

7. The device of claim 1, wherein a ring size of the plurality of macrocyclic π-conjugated planar molecules is enlarged by adding conjugate units into a phenylene precursor between a carbazole and a triple bond, with the enlarged ring size operable to encapsulate clusters of C60 molecules.

8. The device of claim 1, wherein the plurality of C60 molecules are coaxially oriented such that the C60 molecules are arranged linearly between the at least one first electrode and the at least one second electrode.

9. The device of claim 1, wherein the device is configured as a solar cell.

10. The device of claim 9, wherein at least one of the first and second electrodes is a transparent electrically conductive material.

11. The device of claim 1, wherein at least one of the first and second electrodes is formed from a material selected from the group consisting of calcium, indium, aluminum, tin, silver, copper, gold, and combinations thereof.

12. The device of claim 1, further comprising a plurality of stacks located between the first and second electrodes, wherein each stack is insulated from adjacent stacks by interdigitated alkyl side-chains on the macrocyclic π-conjugated planar molecules to substantially prevent inter-stack charge recombination and current leakage.

13. The device of claim 1, wherein the plurality of stacks have an average length sufficient to substantially completely absorb light waves in the visible spectrum.

14. The device of claim 1, wherein the plurality of stacks have an average length sufficient to substantially completely absorb light waves in the infrared and ultraviolet spectrum.

15. The device of claim 1, wherein the plurality of stacks form a large-area homeotropic film of reduction-oxidation active donor/acceptor supramolecular stacks.

16. A method of forming a nano-composite coaxial cable for use in a solar cell, comprising:
    coating a first electrode with a substantially continuous film formed of stackable macrocyclic π-conjugated planar molecules forming a plurality of stacks, with each stack having an outer p-channel and an axial channel substantially perpendicular with a plane of the first electrode, wherein a plurality of C60 molecules are positioned within the axial channel to form an inner n-channel that forms a bulk heterojunction with the p-channel;
    coupling a second electrode with the film opposite the first electrode, wherein the second electrode is substantially parallel with the first electrode.

17. The method of claim 16, wherein the planar molecules are formed of arylene-ethynylene macrocycle (AEM) molecules.

18. The method of claim 17, wherein coating further comprises:
    forming a homeotropic film by heating the continuous film formed of the AEM molecules above a selected temperature to form an isotropic phase in which the AEM molecules in the film are homogenously oriented; and
    cooling the film to room temperature at a rate sufficient to allow the isotropic phase to rearrange into a homeotropic phase to form a large area homeotropic phase in the continuous film.

19. The method of claim 16, wherein coating the first electrode further comprises coating the first electrode with a homeotropic film formed via spin coating.

20. The method of claim 16, wherein coating the first electrode further comprises coating the first electrode via physical vapor deposition on at least one of the first and second electrodes.

* * * * *